United States Patent [19]
Cunningham et al.
[11] 3,754,168
[45] Aug. 21, 1973

[54] METAL CONTACT AND INTERCONNECTION SYSTEM FOR NONHERMETIC ENCLOSED SEMICONDUCTOR DEVICES

[75] Inventors: James A. Cunningham, Dallas; Clyde R. Fuller, Plano, both of Tex.

[73] Assignee: Texas Instruments Incorporated, Dallas, Tex.

[22] Filed: Mar. 9, 1970

[21] Appl. No.: 17,039

Related U.S. Application Data

[63] Continuation of Ser. No. 729,985, May 17, 1968, abandoned.

[52] U.S. Cl....... 317/234 R, 317/234 L, 317/234 M, 29/589, 29/590, 75/176

[51] Int. Cl........... H01l 3/00, H01l 5/00

[58] Field of Search.......... 317/234, 5.2, 5.3; 75/174, 176, 177; 29/179 S, 589, 590

[56] References Cited

UNITED STATES PATENTS

| | | | |
|---|---|---|---|
| 3,184,834 | 5/1965 | Bechtold | 317/234 |
| 3,319,134 | 5/1967 | Csakvary | 317/234 |
| 3,571,913 | 3/1971 | Bodway | 29/571 |
| 3,325,258 | 6/1967 | Folter et al. | 29/183.5 |
| 3,258,898 | 7/1966 | Garibotti | 29/155.5 |
| 3,434,020 | 3/1969 | Ruggiero | 317/235 |
| 2,947,624 | 8/1960 | Semchyshen | 317/234 L |
| 3,030,704 | 4/1962 | Hall | 317/234 L |
| 3,097,329 | 7/1963 | Siemens | 317/235 J |
| 3,243,862 | 4/1966 | Csakvari | 317/234 J |
| 3,290,570 | 12/1966 | Cunningham et al. | 317/234 M |
| 3,519,479 | 7/1970 | Inoue et al. | 317/234 M |

*Primary Examiner*—John W. Huckert
*Assistant Examiner*—Andrew J. James
*Attorney*—Melvin Sharp, Samuel M. Mims, Jr., James O. Dixon, Andrew M. Hassell, Harold Levine, Gerald B. Epstein and John E. Vandigriff

[57] ABSTRACT

Disclosed is a molybdenum-modifying metal ohmic contact and electrical interconnection system for semiconductor devices that are subjected to corrosive environments. A contact and interconnection system is formed using a layer composed of a mixture of molybdenum and a modifier metal, such as titanium, the system having the desired characteristics of the molybdenum system but with greatly increased corrosion resistance which allows devices using such a system to be mounted in nonhermetic packages.

14 Claims, 13 Drawing Figures

JAMES A. CUNNINGHAM
CLYDE R. FULLER
INVENTORS

BY
ATTORNEY

Patented Aug. 21, 1973

3,754,168

6 Sheets-Sheet 2

Patented Aug. 21, 1973 3,754,168

6 Sheets-Sheet 5

METAL CONTACT AND INTERCONNECTION SYSTEM FOR NONHERMETIC ENCLOSED SEMICONDUCTOR DEVICES

This application is a continuation of application Ser. No. 729,985, filed May 17, 1968 now abandoned.

The invention relates to semiconductor devices, particularly relating to devices of the semiconductor integrated circuit type and to a corrosion resistant metal contact and interconnection system for such devices.

From the earliest beginnings of the semiconductor industry, there has been a continual and exhaustive search for better and less expensive ways to encapsulate semiconductor devices. Until quite recently, or until the advent of plastic encapsulation of planar devices, the most common and widely used technique for encapsulating semiconductor devices was to mount the device on a metal and glass header and then to complete the encapsulation of the device with a metal can. The header and can procedure is very expensive, the cost of the header and can sometimes exceeding the cost of the semiconductor device itself.

Since the introduction of plastic encapsulated transistors, diodes and integrated circuits, the semiconductor industry has steadily increased the volume and variety of device types packaged in this manner. In fact, a very large percentage of the total production of silicon integrated circuits produced by the industry today is packaged in plastic enclosures, a plastic package being substantially less expensive than a header and a can. Many devices are encapsulated in epoxy or silicone polymers by transfer molding, with casting also being a common technique. Slightly more expensive techniques involve affixing a metal cap to a ceramic base by means of a strong organic adhesive such as an epoxy resin. Regardless of the exact method of enclosure, it is generally agreed that the seal provided is not hermetic to the extent found in a typical metal-glass encapsulated transistor where leak rates in the order of $10^{-10}$ cc/sec of helium or less are common. Not only does a plastic have relatively high permeation rates to various gases but the transfer of the ambient gases along the metal lead-plastic interface toward the active device has been a particular problem for the industry.

with today's stablized planar devices, the ambient penetration of the packages is probably not a serious problem with respect to possible surface changes of the device itself which might lead to electrical degradation. Of considerable more concern are the problems associated with corrosion of the thin metal layers used to make contacts to and interconnect the different regions of a semiconductor device caused by the penetration of the package by ambient water vapor. The corrosion of the thin metal layers is minimized in single devices due to the minimum amount of metal films, but corrosion also occurs at the lead/bonding pad location if dissimilar metals are used.

An integrated circuit device of the monolythic type, on the other hand, may have a number of active and passive components, such as transistors and resistors, formed by diffusion beneath one surface or major face of a semiconductor wafer with an insulating layer upon the face of the wafer, and metallic layers upon the insulating layer interconnecting the resistors and the various regions of the transistors in a desired pattern through openings in the insulating layer. Due to the need of interconnecting a large number of different semiconductor regions in the wafer, the length of the thin metal layer on the surface of the semiconductor wafer must be great, much more so than with a single device. It is obvious that the more surface area of interconnections there is exposed to the ambient, the greater the opportunity for corrosion. When the complexity of the interconnection patterns is increased, especially in LSI devices, where it has become necessary to form more than one level of interconnections with adequate electrical isolation between the various levels at the crossover points, the topmost or last layer of interconnections is still exposed to the ambient, the lower levels of interconnections being protected from the ambient by the covering insulating layers.

In order to evaluate the degree of sealing provided by plastic enclosures, a commony used environmental test is to subject the encapsulated devices to an elevated temperature-high humidity environment for a period of time, typically up to one thousand hours. In addition, a voltage bias is usually applied to the device during the test period. Failures in the form of open circuits are common and usually are a result of lead corrosion. As previously explained, integrated circuits are particularly susceptible to this type of failure due to the larger portion of the silicon wafer being covered by electrochemically active metal layers. Although considerable doubt exists as to the validity ot this particular accelerated life test to predict or evaluate possible failures in a real use condition, the test is, nevertheless, widely employed and does represent a major hurdle for the semiconductor device manufacturer using plastic enclosures.

Three metals commonly used to form contacts for semiconductor devices are aluminum, molybdenum and tungsten, for example. Aluminum is used quite extensively in single element devices, while both tungsten in combination with gold and molybdenum in combination with gold form excellent metal systems for integrated circuits. In single devices, with bonding pads made from aluminum, gold wires are commonly used to connect the aluminum pad to a lead which allows electrical contact to the "outside world." When aluminum is used in a nonhermetic environment, ionic conduction currents are established between the dissimilar metals, aluminum and gold, upon the absorption of sufficient water vapor on the surface of the device to form an electrolyte of sufficient thickness and conductivity. The aluminum-gold couple is particularly active, self-biasing to about 3 volts.

In the initial stages of the reaction, aluminum (Al), being anodic, oxidizes to $Al^{3+}$, while at the cathode, hydrogen ($H_2$) evolution takes place. The Al ion thus liberated reacts immediately with water according to the following reaction:

$$2Al^{3+} + 3H_2O \rightarrow Al_2O_3 + 6H^+$$

forming insoluble and insulating $Al_2O_3$. The formation of this insulating skin, of course, slows the reaction and tends to protect the anode from further dissolution. Unfortunately, however, the anodic oxide is of sufficient permeability and imperfection that oxidation continues. Usually the attack takes place in localized spots near the cathode resulting in pitting, the aluminum being carried away as $AlO_2^-$ ions.

Aluminum corrosion can also take place in a different way. Since the solution near the cathode becomes basic, unbiased regions nearby will dissolve according to the following reaction:

$$Al + 2OH^- \rightarrow AlO_2^- + 2H^+ + 3e^-$$

In this case no protective skins form. This reaction continues until an open circuit is produced. The dissolved aluminum does not redeposit as the metal at a cathodic site since hydrogen evolution is more favorable. Applying an external bias to the system causes hydrogen evolution to speed up in the cathodically biased areas, while the negatively biased metal regions do not corrode. The anodic reactions are likewise speeded up with oxygen evolution becoming a competitive electrode process, with some of the oxygen migrating to the cathode where it is reduced back to water. Using an aluminum lead wire instead of gold offers protection from the self-biasing or galvanic cell nature of the system, but an aluminum lead can corrode upon application of an external bias.

The molybdenum-gold system behaves somewhat differently. Since some of the oxides of molybdenum (Mo) are water soluble (the hydrated form of $Mo_2O_5$, for example), the metal does not passivate as readily as aluminum. Consequently, the system will self-bias and corrode readily with molybdenum dissolving at the anode until an open circuit is generated. The application of bias speeds both electrode processes. Unless very high electrode biases are applied (above 5 volts), oxygen evolution will not become significantly competitive since molybdenum dissolution is more electrochemically favorable. This can be seen by consideration of the following single electrode potentials:

| | |
|---|---|
| $Mo \rightarrow Mo^{3+} + 3e^-$ | 0.2 volt |
| $Mo + 3H_2O \rightarrow MoO_3 + 6H^+ + 6e^-$ | –0.1 volt |
| $4OH^- \rightarrow 2H_2O_2 + 4e^-$ | –0.4 volt |
| $2H_2O \rightarrow 4H^+ + O_2 + 4e^+$ | –1.2 volts |

Also, at high external biases, gold (Au) dissolution at anodic sites becomes competitive, but since the oxidation potential of gold is quite negative, oxygen evolution is predominant. Nevertheless, some gold can dissolve at the anode, according to the following reaction:

$$Au + XH_2O \rightarrow Au^+(aq) + e^- \qquad -1.68 \text{ volts}$$

Gold, of course, forms no stable oxides so that the gold that does dissolve anodically is removed uniformly over the entire anodic area with no pitting resulting therefrom. The gold ion is transported in the electrolyte to the nearest cathodic region where it plates back out as the metal.

Mainly because of the significantly decreased solubility of the oxides of tungsten (W) in aqueous media as compared to molybdenum oxides, the WAu system is considerably more corrosion resistant than MoAu. For example, $WO_3$ is soluble only in hot, yerg high pH solutions, whereas $MoO_3$ is soluble in water at room temperature. Thus, self-biased induced corrosion rates are very low since tungsten tends to become passive. The application of external bias results in mainly electrolysis of water with dissolution of gold as a minor competitive anodic reaction, but tungsten will dissolve slowly in high pH anodic regions.

From the above discussion of corrosion, it is obvious that the requirements of a barrier metal-gold electrical contact and interconnection system for a semiconductor device in a hermetic package are not sufficient to allow the barrier metal-gold systems described to be used in a nonhermetic environment. In addition to the requirements of adhesion to silicon and silicon oxide and the lack of formation of intermetallic compounds between the barrier metal and gold, the barrier metal also must not corrode or must only minimally corrode in nonhermetic enclosures, especially, especially in high humidity environments.

In view of the above, a general object of the present invention is a new and improved electrical contact and interconnection system for semiconductor devices.

A specific object of the invention is a new and improved electrical contact and interconnection system for semiconductor devices having increased corrosion resistance over known metal contact systems.

Another object of the invention is a new and improved electrical contact and interconnection system for semiconductor devices subject to high humidity environments, thus allowing the elimination of hermetic enclosures.

Still another object of the invention is a new and improved electrical contact and interconnection system for semiconductor devices that adhere well to silicon and silicon oxide.

Yet another object of the invention is a barrier metal for a new and improved electrical contact and interconnector system that forms no intermetallic compounds with gold.

The novel features believed to be characteristic of this invention are set forth in the appended claims. The invention itself, however, as well as other objects and advantages thereof may best be understood by reference to the following detailed description when read in conjunction with the accompanying drawings wherein FIG. 1 is a plan view, illustrating a wafer of semiconductor material having a planar transistor formed therein, with openings formed in the insulating layer on the surface of the wafer for application of contacts.

Figure 4:
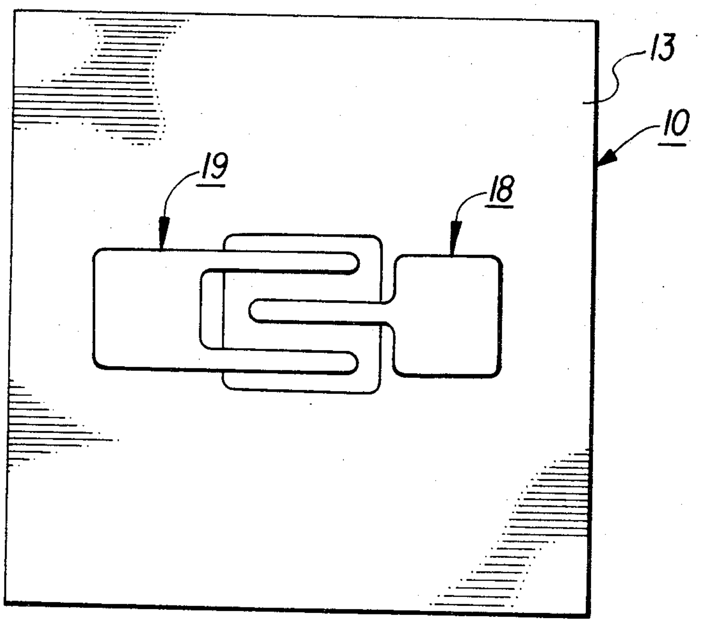
FIG. 4 is a plan view, illustrating the wafer shown in FIG. 1, after the contacts and bonding pads have been applied.

FIGS. *5a* and *5b* are a sectional view and a plan view, respectively, of the same wafer shown in FIG. 4 after being mounted with leads and encapsulated in plastic. FIG. *5a* is a sectional view of FIG. *5b* taken along the line *5a—5a*. The top portion of the plastic encapsulation of FIG. *5b* is cut away to show the mounted device.

Figure 6:
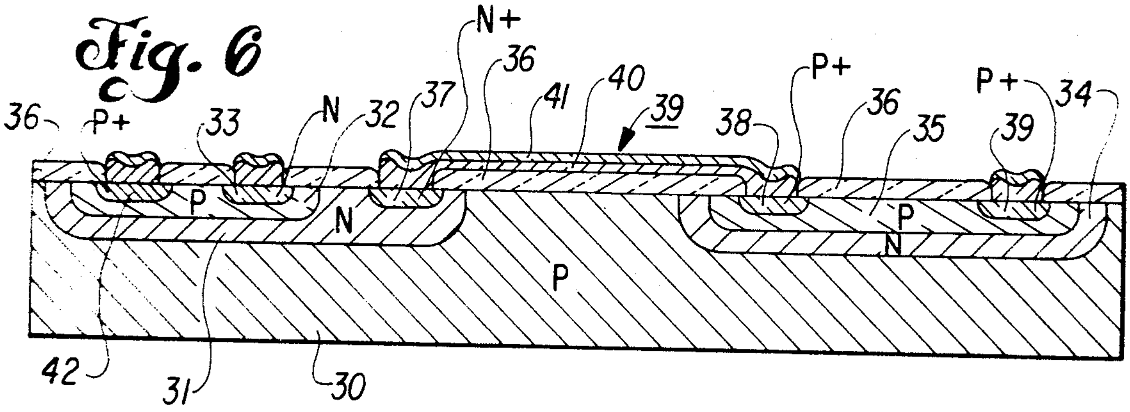

FIG. 6 is a sectional view, illustrating an integrated circuit having a single level of interconnections.

Figure 8:
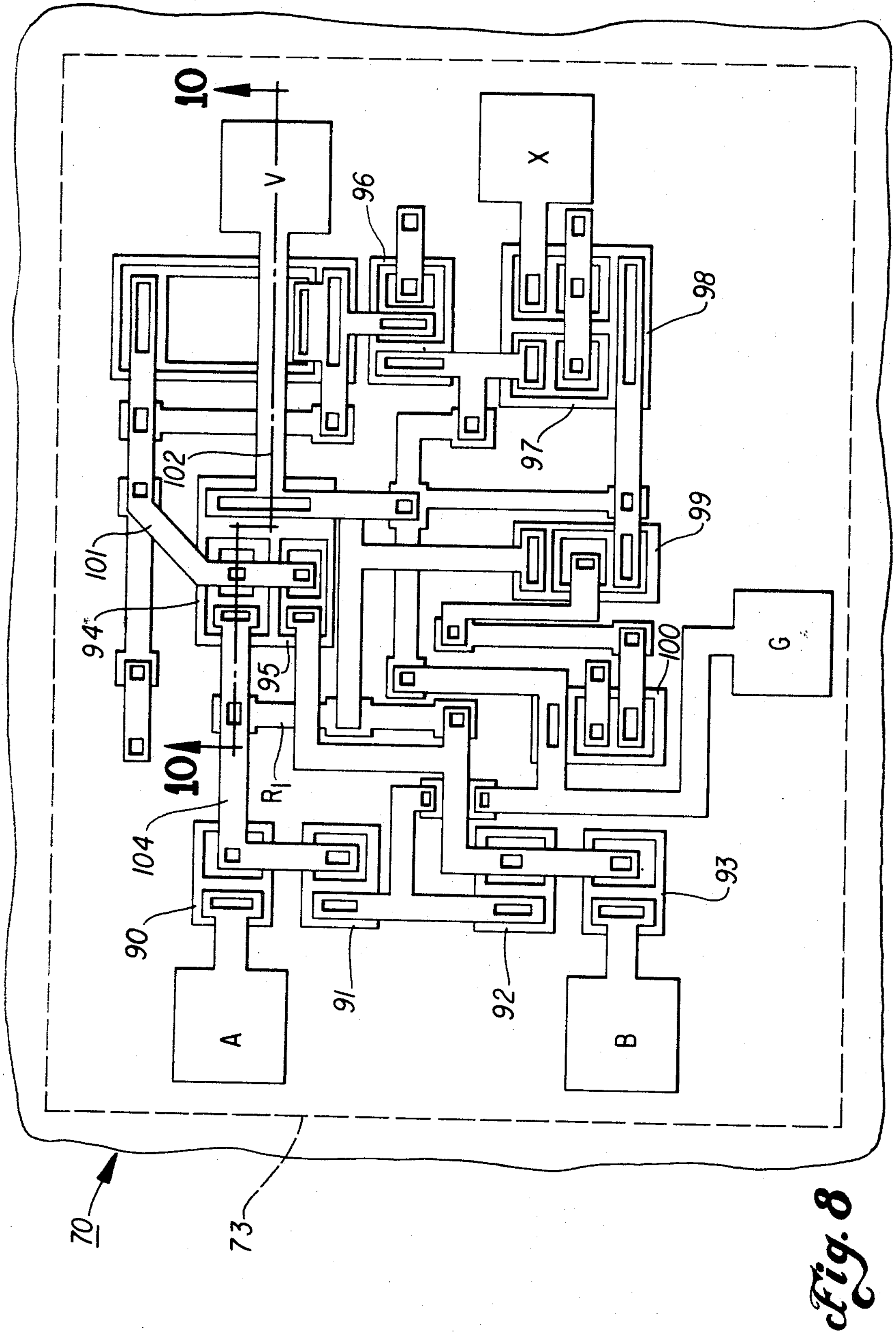

FIG. 8 is a plan view, illustrating the layout of circuit components in one of the functional elements in the substrate shown in FIG. 8 requiring more than one level of interconnections.

Figure 7:
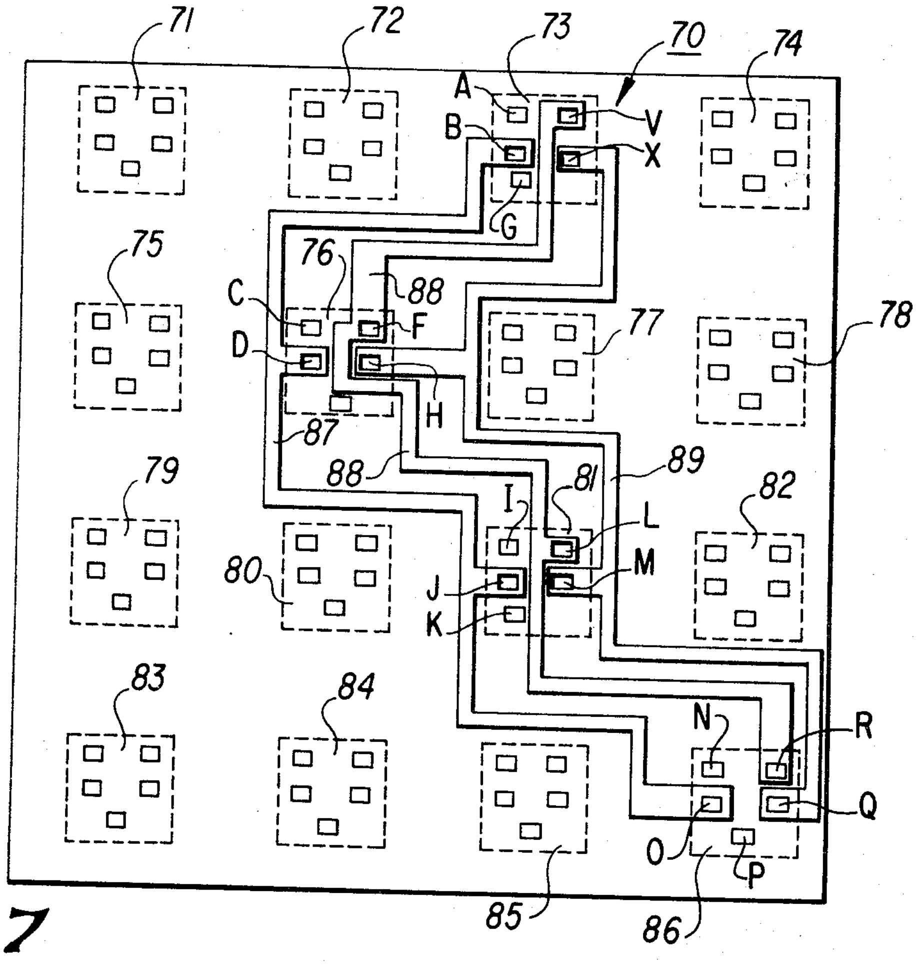

FIG. 7 is a plan view, illustrating a semiconductor substrate containing a plurality of functional elements.

Figure 9:
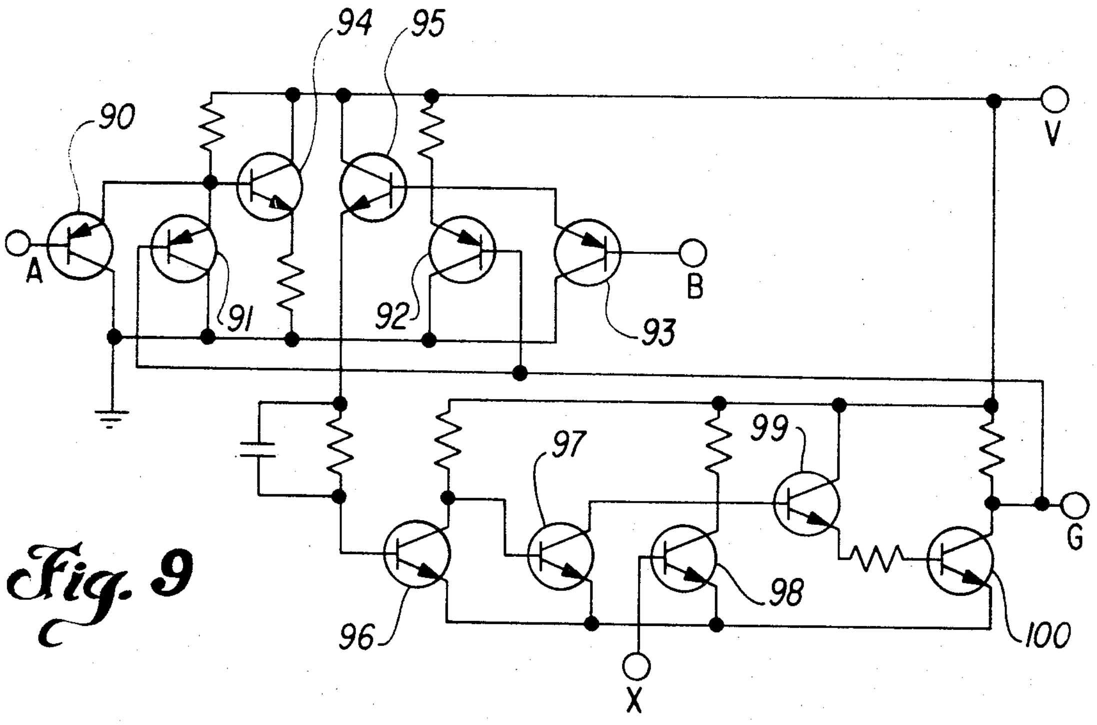

FIG. 9 is a schematic diagram of an electronic circuit in one of the functional elements as shown in FIG. 8.

Figure 11:
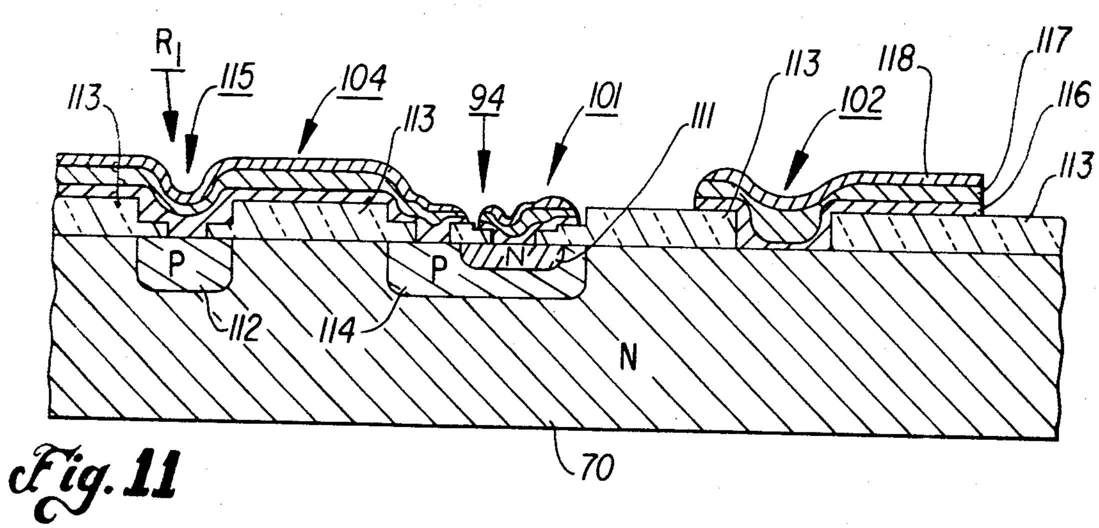
Figure 12:
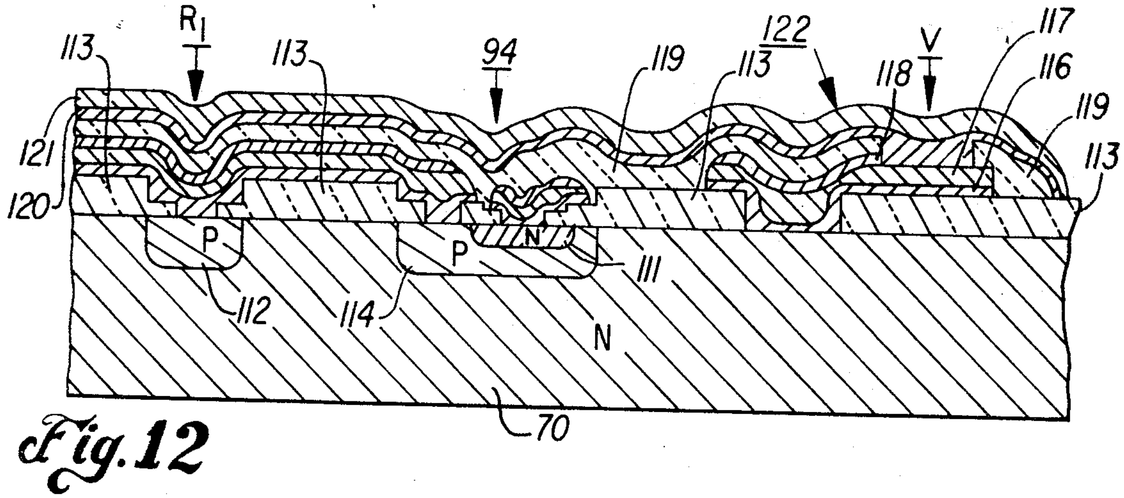
Figure 10:
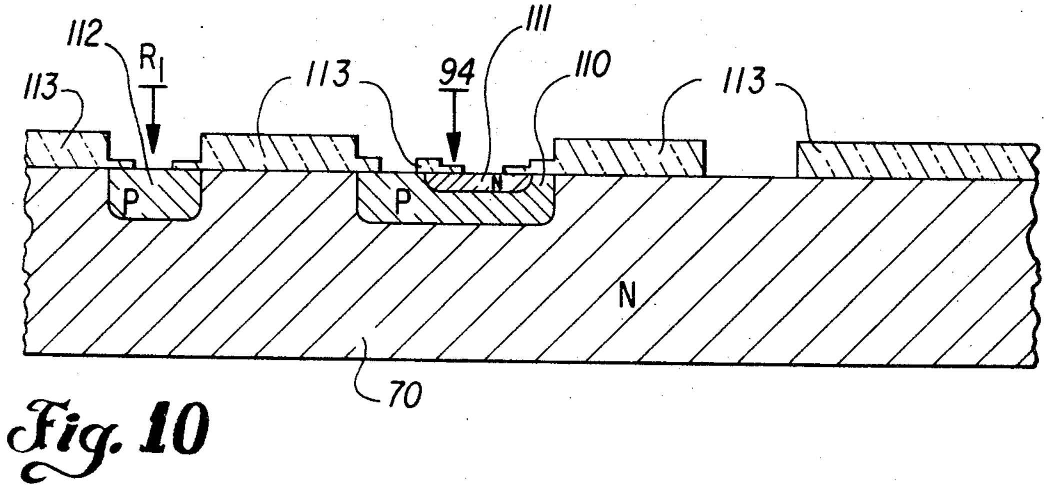

FIGS. 10–12 are sectional views, illustrating the fabrication of the integrated circuit shown in FIG. 7, taked along the sectional line 10—10.

In brief, the invention involves a corrosion resistant contact and interconnection system for semiconductor devices which can be either unencapsulated or encapsulated in nonhermetic packages. The system uses a homogeneous mixture of controlled amounts of molybdenum and a modifier metal having greater corrosion resistance than molybdenum to increase the corrosion resistance of molybdenum. Molybdenum is a very advantageous material for metal contact systems, as fully explained in the patent "Metallic Contacts for Semiconductor Devices," U.S. Pat. No. 3,341,753, filed Oct. 21, 1964, by James A. Cunningham and Robert P. Williams and assigned to the same assignee. Suffice to say that some of molybdenum's many advantages are that it adheres to silicon and silicon oxide, does not form any intermetallic compounds with gold and serves as a barrier between the gold and semiconductor substrate when gold is used as an overlying metal to serve as a protective layer and as a low electrical resistance path.

One of the required characteristics of a modifier metal used to combine with molybdenum to eliminate or decrease molybdenum's susceptibility to corrosion in aqueous or high humidity environments is that the modifier metal must be more corrision resistant than molybdenum. This requires that the modifier metal must be only slightly soluble in aqueous acids (except hydrogen fluoride (HF) containing acid solutions); the oxides of the metal must be more stable than oxides of molybdenum and should be only slightly soluble in various acids; the metal must tend to form passivating oxides resulting in wide variations in oxidation potentials; and the metal must have excellent corrosion resistance. In addition, the modifier metal must have a high melting point and a slow rate of self-diffusion.

However, none of the modifier metals having the above-mentioned requirements are sufficiently metallurgically stable with gold to allow any one of them to serve as the barrier metal in a barrier metal-gold contact system.

The ideal modifier is not soluble in and does not form any compounds with molybdenum. However, every metal that meets all the above-mentioned requirements either forms a compound with or is soluble in molybdenum. No formation of compounds with molybdenum and the modifier metal or solubility of the modifier metal in molybdenum are desired for the etchability of the molybdenum and modifier metal mixture changes as the percentage of each element in the mixture changes. The ease of etching decreases as the percentage of solubility increases, with the mixtures forming compounds the most difficult to etch when defining the desired connection patterns. Examples of modifier metals that have all of the desired characteristics except absence of either compound formation with or solubility in molybdenum are titanium, tantalum, chromium, zirconium, hafnium, and silicon.

The preferred modifier metal is titanium which is soluble in molybdenum in all proportions. Titanium forms no compounds with molybdenum. The remainder of the modifier metals mentioned above are ranked for desirability in descending order with the following reasons for that ranking: Tantalum and chromium form no compounds with molybdenum but are soluble in molybdenum in all proportions. Chromium's higher oxide is water soluble and this is not as corrosion resistant upon application of a high positive bias. Zirconium forms compounds with molybdenum as also do hafnium and silicon.

A homogeneously mixed layer of molybdenum and a modifier metal, preferably titanium, can be easily prepared by rf or triode sputtering from cathodes fabricated by conventional power metallurgy methods.

The lower limit of the percentage of the modifier metal in the molybdenum-modifier metal mixture is determined by the least amount of the modifier metal that will increase the corrosion resistance of molybdenum to a sufficient degree. Random impurities in small amounts, such as the modifier metals named above, unintentionally introduced into molybdenum have no effect on the corrosion resistant characteristics of molybdenum contacts; a significant amount of the modifier metal must be intentionally introduced to be effective. The practical lower limit seems to be about 3 percent of the modifier metal by weight in a mixture of molybdenum-modifier metal. Percentages of the modifier metal below about 3 percent do not impart sufficient corrosion resistance to the molybdenum-modifier metal contact to be effective. As the percentage of the modifier metal in the mixture increases, the passivation or corrosion resistance of the contact increases. However, after the amount of the modifier metal is increased about about 20%, which amount imparts excellent corrosion resistant properties to the contact, deleterious characteristics of the modifier metal tend to be imparted to the mixture.

The upper limit of the amount of modifier metal in the molybdenum-modifier metal mixture is determined by both the amount of the modifier metal that the molybdenum matrix can hold without the modifier metal reacting with the gold layer and raising the resistivity of the gold layer adjacent the molybdenum-modifier metal layer and the difficulty of defining the molybdenum-modifier metal contact, the etchability of the layer decreasing as the percentage of the modifier metal increases. The mixture becomes extremely difficult to etch with percentages of the modifier metal above about 35 percent with the molybdenum-modifier metal mixture becoming metallurgically unstable and reacting with the gold with percentages of the modifier metal in excess of about 60 percent. The use of contacts having percentages of the modifier metal between about 35 percent and about 60 percent are feasible but require more care and more time due to the difficulty of defining the individual contacts and interconnections. The preferred percentage for the modifier metal appears to be about 20 percent. The lower, upper and preferred percentages of the modifier metal in the molybdenum-modifier metal contact given above are averages and will not be exactly true for each modifier metal, as each of the possible modifier metals mentioned above have properties that are somewhat different which will either lower or raise the example percentages given.

Figure 1:
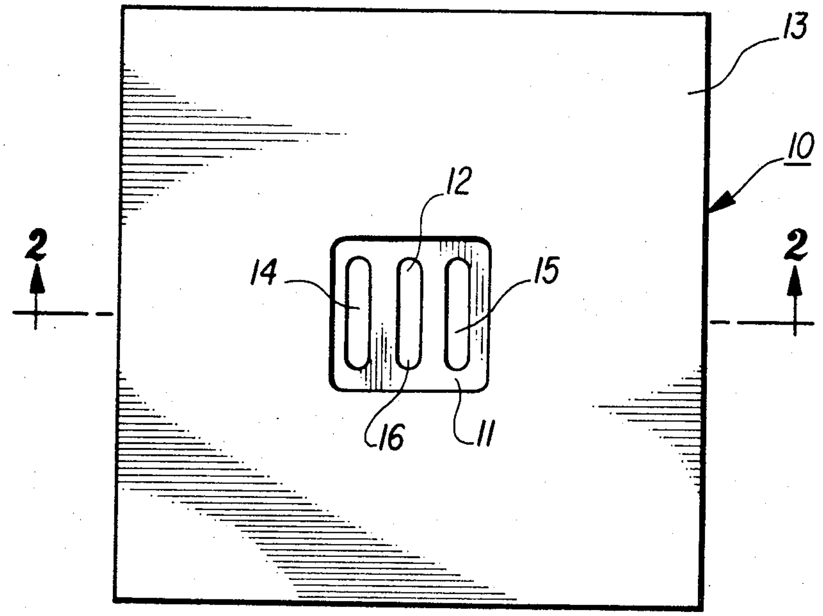
Figure 2:
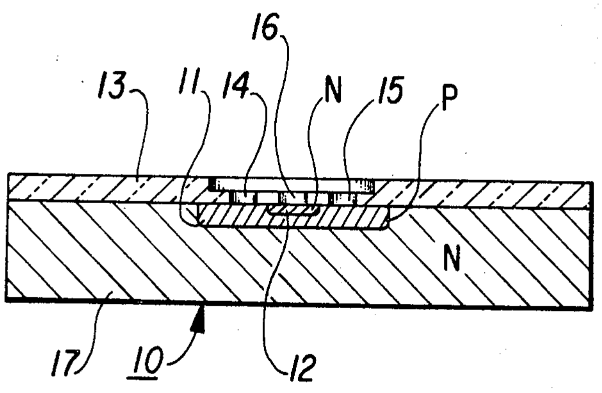
FIG. 2 is a sectional view of the semiconductor wafer shown in FIG. 1, taken along the line 2—2.

Referring now to the figures of the drawings, there is shown in FIGS. 1 and 2 a semiconductor wafer 10 having a transistor formed therein, including base and emitter regions 11 and 12, respectively, the remainder of the wafer providing the collector region 17. The transistor is formed by the common planar technique, using successive diffusions with silicon oxide masking. Since the conventional fabrication methods used to form the devices illustrated are not a part of the invention and are so well known in the semiconductor industry that one skilled in the art would know such methods, they are not detailed here. For full descriptions of such conventional fabrication methods, refer to the following sources: *Integrated Circuit-Design Principles and Fabrication*, Ray M. Warner, Jr. and James Fardemwalt, McGraw-Hill (1965); *Silicon Semiconductor Tech-* nology, McGraw-Hill (1965); and *Physics and Technology of Semiconductor Devices*, A. S. Grover, Wiley & Sons (1967).

In the planar process, an oxide layer 13 is formed on the top surface of the wafer, with the layer over the collector region being thicker than over the base region, resulting in a step configuration. For high frequencies, the geometry of the active part of the transistor is extremely small, the elongated emitter region 12 being perhaps 0.1 to 0.2 mil (0.002 inch) wide and less than a mil long. The base region 11 is about 1 mil square. A pair of openings 14 and 15 are formed for the base contacts, and an opening 16 is formed for the emitter contact, the latter opening being the same as used for the emitter diffusion. Due to the extremely small size of the actual base and emitter contact area, being on the order of about one- or two-tenths of a mil in width, the contacts must be expanded out over a silicon oxide to facilitate bonding of leads for the base and emitter connections, as will be explained below. The size of the semiconductor wafer is selected for convenience in handling, with a typical size for the wafer 10 being 30 mils on each side and 4 mils thick (none of the drawings are drawn to scale for clarity of illustration). Typically, the wafer 10 is merely a small undivided part of a large slice of silicon, perhaps 1 inch in diameter and 8 mils thick, during all the processed steps described below, and this slice is broken into individual wafers after the contacts are applied.

Figure 3:
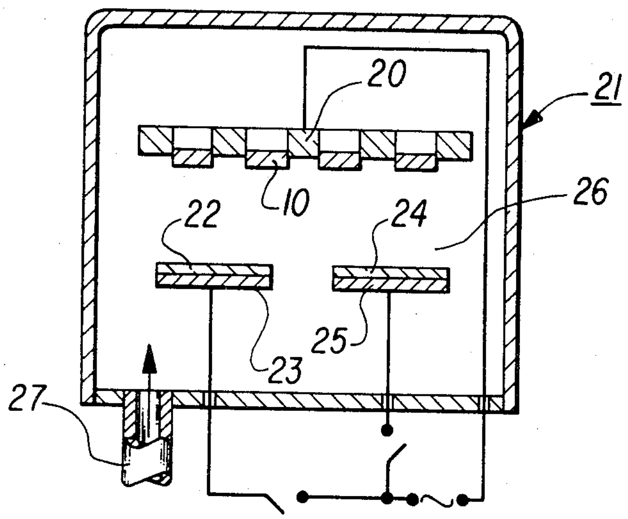
FIG. 3 is a pictorial view, partly in section, illustrating an rf-sputtering apparatus suitable for applying the contacts to the wafer as shown in FIG. 4.

To deposit a layer of molybdenum-modifier metal mixture from which the emitter contact 18 and the base contact 19 are formed, as shown in FIG. 4, the wafer 10, as a part of a large slice, along with the number of other slices is secured to the support plate 20 in a conventional rf-sputtering apparatus 21, as shown in FIG. 3. For ease of description, only the formation of molybdenum-titanium contacts will be described. Contacts formed from molybdenum-tantalum, molybdenum-chromium, molybdenum-zirconium, molybdenum-hafnium and molybdenum-silicon are formed in the same manner. The support plate 20 acts as the anode in the rf-sputtering circuit while the cathode is an rf-sputter plate 22 comprising the metal which is desired to be deposited on the wafer 10. There will be as many sputter plates as there are different metals to be deposited. The rf-sputter plate 22 is composed of the desired molybdenum-titanium mixture. Such a plate can be easily formed by conventional powder metallurgy methods and can be purchased from a company such as Materials Research Corporation, for example. Since the molybdenum-titanium sputter plate is formed from a homogeneous mixture of molybdenum and titanium powders, it is obvious that any desired percentage combination is easily obtainable. The sputter plate 22 is supported by the support plate 23 which is electrically connected through a switching arrangement to an rf-power source (not shown).

For gold deposition, the gold sputter plate 24 is placed on its support plate 25, which, in turn, is also connected by a switching arrangment to the power source. FIG. 3 is an idealized picture used for the description of a typical rf-sputtering operation, but the figure is not entirely correct as to the actual placement of the different elements of the rf-sputtering apparatus 21. It is obvious, of course, that to obtain uniform layers of metal on all of the substrates, each sputter plate must be as large as the area of substrates to be covered with the metal and located so that the distance from the surface of each sputter plate to the surface of each substrate is the same. Therefore, each rf-sputter apparatus has means (not shown) within the chamber 26 to locate the particular sputter plate to be used in position for each sputtering step.

Argon, for example, under pressure of about 5–15 microns of mercury is introduced through the opening 27 into the rf-sputtering apparatus 21. The rf-energy is applied between the support plate 20 and the molybdenum-titanium sputter plate 22, at a frequency of about 15 megacycles per second, for example, for a period of time sufficient to form a layer of molybdenum-titanium on the wafer 10 having a thickness of about 2,500 A., for example. When the desired thickness of molybdenum-titanium is obtained, the rf-energy is disconnected and reapplied between the support plate 20 and the gold sputter plate 24. The rf-energy is applied for a period of time sufficient to form a layer of gold on the previously despositied molybdenum-titanium layer to a thickness of about 10,000 A., for example. After the desired thickness of gold is obtained, the energy source is disconnected from the apparatus 21, the argon flow is turned off and the wafer 10 is removed. The molybdenum-titanium layer, in addition to being deposited by the rf-sputtering described, can also be deposited by triode sputtering. The gold layer can also be deposited by conventional evaporation methods, if so desired.

After removing the slices, including wafer 10, from the rf-sputtering apparatus, the excess portions of the gold and molydbenum-titanium layers are removed by subjecting the silicon slices to selective photoresist masking and etching treatments. A thin coating of a photoresist polymer, Eastman Kodak's KMER, for example, is applied to the entire top surface of the gold layer. The photoresist is exposed to ultraviolet light through a mask which allows light to reach the areas where the gold and molybdenum-titanium layers are to remain. The unexposed photoresist is then removed by developing a photodeveloping solution. At this point, a coating of photoresist overlies the portion of the gold and molybdenum-titanium layers which, after definition, are to form the emitter and base contacts and expanded leads as shown in FIG. 4.

Figure 5A:
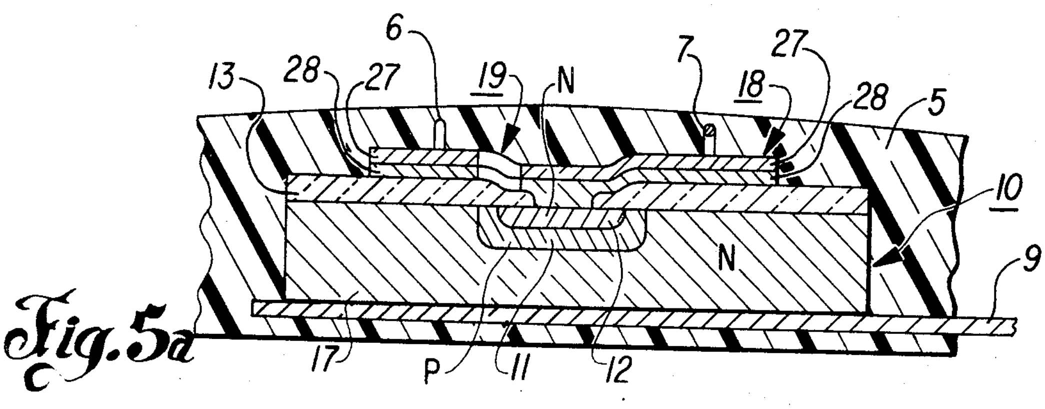
Figure 5B:
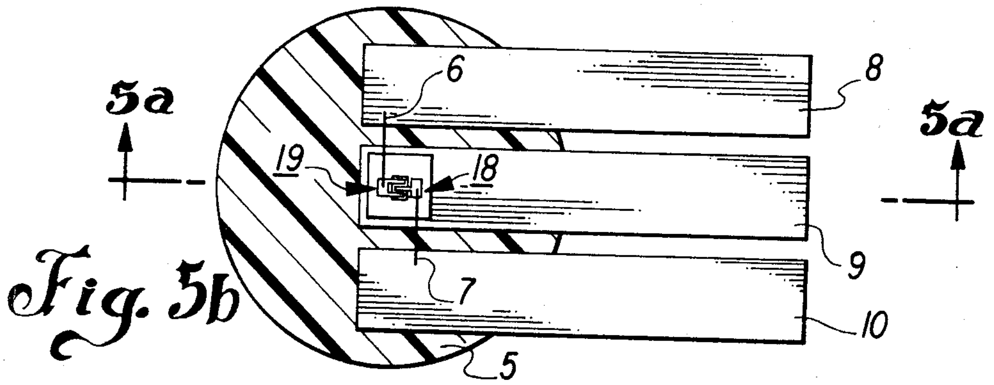

The slice is now subjected to an etching solution to remove the unmasked portions of the gold layer 27. A suitable etchant for gold is an alcoholic iodine plus potassium iodide solution. The gold is subjected to the etch solution for a period of time sufficient to remove the unmasked gold and define the gold layer 27 forming the top layer of the contacts 18 and 19. The molybdenum-titanium layer 28 exposed by the gold removal is removed also by a chemical etchant such as a basic solution of potassium ferricyanide to form the molybdenum-titanium layer 28 of contacts 18 and 19 which is adherent to both the gold layer 27 of each contact and the silicon and silicon oxide of wafer 10. The wafer 10 is now ready to be mounted and packaged. As one example of a nonhermetic enclosure, a plastic package 5 is shown in FIGS. 5*a* and 5*b*. After the wafer 10 is mounted on the collector lead 9, a gold lead wire 6 is connected between the base contact 19 and the base lead 8 by ball bonding, for example, and another gold lead wire 7 is connected between the emitter contact 18 and the emitter lead 10. The plastic package 5 is then formed over the wafer 10 by transfer molding, for example.

To provide good, low resistance, ohmic contact to silicon with molybdenum-titanium, as is true with all refractory metal contacts, such as molybdenum, it is necessary that the surface region of the silicon where contact is to be made be of high impurity concentration, either N-type or P-type. When either boron or phosphorous is used as the impurity, for example, the surface concentration for good contact should be greater than $2 \times 10^{19}$ atoms/cc., and preferably above $10^{21}$. Electrical contact can be made to silicon surfaces that contain lesser concentrations, but the contact resistance increases as the impurity concentration decreases.

In typical transistors, such as that described above, the N-type emitter is ordinarily a region of very high concentration, especially at the surface since the region is formed by a second diffusion. Even though generally of lower concentration than the emitter region, the base region is also ordinarily doped heavily enough, at the surface at least, to provide low resistance contact. If not, a shallow P-type diffusion step is introduced prior to the deposition of the contact material. This diffusion would be through openings of about the same size and in the same place as the openings 14 and 15 formed for the base contacts, and preferably the exact same openings are used. In integrated circuits, extra diffusion operations to produce high surface concentrations in the contact areas are more likely to be necessary. This is necessary because the collector contact is made on top of the wafer to a region which may be an epitaxial layer of low impurity concentration or else may be the first diffusion in a triple diffused device, this first diffusion generally being of very low impurity concentration so that the two subsequent diffusions may be made. Also the base region of the transistor or an integrated circuit is odrinarily made simultaneously with the formation of a diffused resistor. Since the resistivity of the material which forms this diffused resistor region should be fairly high, the base concentration must be fairly low. Accordingly, in a typical integrated circuit with NPN transistors and P-type diffused resistors, the impurity concentration for the collector, base and resistor regions must be supplemented for contact purposes.

An integrated circuit requiring only one level of interconnections is shown in FIG. 6. The integrated circuit is formed in a P-type silicon wafer 30 having a transistor formed on the left end by a diffused N-type collector region 31, a P-type base region 32 and an N-type emitter region 33. On the right-hand side, a resistor is formed in an isolation region 34, the resistor itself being the P-type diffused region 35. Before the second N-type diffusion, which forms the emitter region 33, an opening is formed in the insulating layer 36, silicon oxide for example, where the collector contact is to be made and a high concentration N-type region 37 is created simultaneously with the emitter region 33. The high concentration P-type regions 38, 39 and 42 are produced by a subsequent selective boron diffusion, for example, using the oxide layer 36 as a mask. Thereafter, openings are formed in oxide layer by conventional photolithographic and etch methods where the transistor and resistor contacts are to be made and the deposition procedure, as previously described, is used to apply molybdenum-titanium layer 40 and gold layer 41 on the top surface of the integrated circuit, followed by the selective removal of both layers to produce the desired pattern of contacts and interconnections. The collector 31 is connected to one end 38 of the resistor by an interconnection 39 which extends over the oxide. The interconnection 39, as do the other contacts of the integrated circuit; has a layer 40 of molybdenum-titanium on and adherent to the insulating layer 36 and the exposed surfaces of the wafer 30 and a gold layer 41 on and adherent to the molybdenum-titanium layer 40. A typical integrated circuit would include in the same semiconductor wafer many transistors and resistors of the type seen in FIG. 6, rather than one of each.

The necessity for the extra P+ type diffusion to provide low contact resistance may be unnecessary in some cases if a flash or a very thin layer of aluminum is applied to the silicon surface or if a thin layer of platinum is applied to the silicon surface and sintered to form platinum silicide prior to depositing a layer of molybdenum-titanium on the surface of the device.

In FIG. 7 is shown an integrated circuit requiring more than one level of interconnections. A slice of substrate 70 of semiconductor material, silicon, for example, has a number of functional elements formed therein. Although only sixteen such functional elements are shown for illustration, a much larger number ordinarily is utilized. Each of the functional elements 71–86 contains the necessary number of transistors, resistors, capacitors or the like, the interconnected to produce a desired electrical circuit function. For example, the functional element 73 may comprise the circuit shown schematically in FIG. 9 and by plan view in FIG. 8. The circuit of functional element 83 includes the P-N-P transistors 90, 91, 92 and 93 and N-P-N transistors 94, 95, 96, 97, 98, 99 and 100, the three input terminals A, B, and X and output terminal B. These terminals, along with the voltage supply terminal V, correspond to the five identically designated terminals on the functional element 73 in FIG. 7.

If it is desired to appropriately interconnect the four functional elements 73, 76, 81 and 86 of the sixteen functional elements 71–86 for their cooperative action to produce a unitary electrical function, as depicted in FIG. 7, the terminals B, D, J, and O of functional elements 73, 76, 81 and 86, respectively, are electrically joined by the interconnector 87. Similarly, the terminals V, F, L and R are electrically joined by the interconnector 88, and the terminals X, H, M and Q are electrically joined by the interconnector 89. Recognizing that there are already a large number of first level electrical interconnections joining the various transistor with one another as well as with the other circuit components and terminals, as shown in FIG. 7, it will be appreciated that the interconnectors 87, 88 and 89 must necessarily overlie some of the first level metal interconnection pattern shown in FIG. 8. For this reason, and also because the interconnection between functional elements are preferably made in an operation separate from the one by which the interconnections within an element are formed, the interconnection pattern of FIG. 7 is formed as a second level, separated from the first level interconnection pattern by an insulating medium.

The transistors and the other circuit components may be formed within or upon the semiconductor substrate 70 by any of the techniques well known in the integrated circuit art such as, for example, epitaxial growth or diffusion. Thus, looking at FIG. 10 there is depicted, in section, a portion of the integrated circuit structure shown in FIG. 8 before the application of any of the metal interconnectors. The N-P-N transistor 94 comprises an N-type collector formed by the substrate 70, the diffused P-type base region 110, and an N-type diffused emitter region 111. The Resistor $R_1$ is provided by the P-type diffused retion 112, formed simultaneously with the base region 110 of the transistor 94. An insulating layer 113, silicon oxide for example, on the top surface of the substrate acquires a stepped configuration, as shown, due to the successive diffusion operations. Thereafter openings or holes are formed in the insulating layer 113 for subsequent first level interconnection ohmic formation.

As the next step, a thin molybdenum layer 116 of about 1,200 A. in thickness, for example, is deposited upon the surface of the insulating layer 113 and in ohmic contact with the semiconductor material, such as silicon, within the openings in the insulating layer 113. The metal layer 116 can also be formed of a molybdenum-titanium mixture but the corrosion resistance obtained by molybednum-titanium is not needed for the insulating layer 119, as shown in FIG. 12, covers and protects the lower molybdenum interconnections. Various techniques may be utilized for the deposition of the molybdenum layer, as previously explained in regard to molybdenum-titanium. A gold layer 117 is formed on the molybdenum layer, by any of the methods previously explained, to a thickness of about 7,500 A., for example. Other high conductivity metals such as copper, for example, which is metallurgically stable with molybdenum, can be used instead of the gold layer. S econd molybdenum layer 118 is formed on the gold layer to a thickness of about 1,200 A., for example. The molybdenum-gold-molybdenum layers are successively etched, as previously described, to provide the portion for the first level interconnectors, such as the interconnector 104 ohmically connecting the base 114 of the transistor 94 to one end 112 of the resistor $R_1$, the interconnector 101 making ohmic contact to the emitter 111 of the transistor 94 while the interconnector 102 ohmically connects the collector 70 of the transistor 94 to the supply terminal V, as illustrated in FIG. 11. Each interconnector has a bottom layer 116 of molybdenum, an intermediate layer 117 of gold and a top layer 118 of molybdenum.

An insulating layer 119 of silicon oxide, for example, is deposited by any suitable technique, for example, evaporation or sputtering on the molybdenum layer 118 and then selectively etched to expose the surface of the molybdenum layer 118 solely at the terminal point V, as depicted in FIG. 12. The purpose of the insulating layer 119 is to electrically isolate the first level metal interconnections, such as 104, from the second level metal interconnections which are to be subsequently formed. Accordingly, the layer 119 may be formed of other inorganic materials such as silicon nitride, aluminum oxide, or various organic insulating materials. In this particular example, the insulating layer 119 is silicon oxide, deposited by rf-sputtering to a thickness of about 20,000 A. For better ohmic contact between the two levels of interconnectors, the portion of the molybdenum layer 118 exposed by the opening in the insulating layer 119 at V is removed by photosensitive etching techniques so that contact can be made directly to the gold layer 117.

A molybdenum-titanium layer 120 is deposited upon the insulating layer 119 to a thickness of about 1,200 A. by rf-sputtering, for example, followed by the deposition by evaporation, for example, of a gold layer 121, formed to a thickness of approximately 7,500 A., for example. The gold and molybdenum-titanium layers 121 and 120, respectively, are then selectively etched to provide the pattern for the second level interconnection 122, interlevel contact being provided at the bonding pad V between the gold and molybdenum-titanium layers 117 and 120, respectively. As previously explained, the gold is easily removed by etching in an alcoholic iodine plus potassium iodide solution while the molybdenum-titanium is removed by etching in the same etch solution used for pure molybdenum, potassium ferricyanide. The top gold layer 121 adheres well to the molybdenum-titanium layer 120. An external bonding wire of gold (not shown), for example, may then be bonded by thermal compression bonding to the gold layer 121. Among the advantages of this system, as illustrated in FIG. 12, is the extremely good adherence of the molybdenum and molybdenum-titanium layers 118 and 120, respectively, to the insulating layer 119. Increased adhesion caused by the titanium is observed using mixtures of molybdenum and titanium having as little as 3 percent titanium. The titanium (Ti) increases the adhesion of molybdenum to silicon oxide or glass surfaces through the very strong Ti-O bonds formed and increases adhesion to gold through Ti-Au compound linkages formed at the WTi-Au interface. If a three, four or higher level (to the nth level) contact and interconnection system levels are needed, each of the levels besides the final one can be of pure molybdenum with the final level being molybdenum-titanium with gold combination, the overlying layer of gold facilitating bonding with an external wire. If it is desired to connect a lead wire directly to the lower level molybdenum interconnector, a layer of gold can be formed only on a portion of the molybdenum exposed by an opening in the overlying insulating layer so that a gold wire can be bonded to the limited gold area.

To more fully demonstrate the greatly increased corrosion resistance of a mixture of molybdenum and modifier metal over molybdenum, a few examples are given as follows:

In a conventional water-drop test where a 6 volt potential is applied across a number of thin strips of the metal to be tested and a drop of $10^{-3}$ percent phosphoric acid is placed across the strip to complete the circuit, a molybdenum-gold-molybdenum 3-layer metal strip failed in 20 seconds by the etching away of the anodic molybdenum layers. An 80 percent molybdenum and 20 percent titanium-gold-80 percent molybdenum and 20 percent titanium 3-layer strip did not fail until 20 minutes had passed by the etching of the refractory alloy and gold at the anode. DIssolution of both metals proceeded at approximately the same rate.

In the metallurgical stability test, a strip of metal comprising a mixture of 19 percent titanium and 81 percent molybdenum was applied to a thickness of 5 microinches, covered with a layer of gold to a thickness of 28 microinches and heated to 600°C for 1 hour in a nitrogen atmosphere. The initial sheet resistivity of the strip was 0.044 ohm/sq. which increased to 0.098 ohm/sq., indicating very slight reaction of the titanium in the molybdenum with the gold. In another test of similar material, an initial resistivity of 0.064 ohm/sq.

was unchanged after 5 minutes at 500°C. Both tests indicate reasonable metallurgical stability.

Various other modifications of the disclosed processes and embodiments will become apparent to persons skilled in the art without departing from the spirit and scope of the invention as defined by the appended claims.

What is claimed is:

1. A semiconductor device comprising a semiconductor substrate having first and second zones of opposite conductivity type forming a p-n junction therebetween, terminating at one surface of said substrate beneath an insulating layer on said one surface, said insulating layer defining an opening therein exposing a portion of said first zone, and a metallic layer on and adherent to said insulating layer and ohmically connecting to the exposed portion of said first zone, said metallic layer comprising a mixture of molybdenum and 3 percent to 20 percent by weight of a modifier metal selected from the group consisting of titanium, tantalum, zirconium, chromium, hafnium, and silicon.

2. The device as defined in claim 1, including a high conductivity metal layer on at least a portion of said metallic film.

3. The device as defined in claim 2, wherein said high conductivity metal layer is gold.

4. An electrical connection system for an integrated circuit having apilurality of circuit components formed adjacent one surface of a substrate and an insulating layer on said one surface having a plurality of openings exposing portions of said circuit components, said system comprising:

multilayer interconnections on said insulating layer electrically connecting certain portions of said circuit components through said openings in said insulating layer, another insulating layer on said multilayer interconnections having a plurality of openings exposing portions of said multilayer interconnections, electrical interconnections on said another insulating layer electrically connecting certain portions of said multilayer interconnections, said multilayer interconnection having a lower layer comprised of molybdenum, an intermediate high conductivity metal layer, and an upper layer comprised of molybdenum, said electrical interconnections including a lower layer comprised of a mixture of molybdenum and a modifier metal having greater corrosion resistance than molybdenum and an upper high conductivity metal layer, whereby the resulting electrical connection system exhibits significant corrosion resistant properties in semiconductor device operating environments.

5. The system as defined in claim 4, wherein said high conductivity metal layer is gold.

6. The system as defined in claim 4, wherein said modifier metal is taken from the group consisting ot titanium, tantalum, chromium, zirconium, hafnium, and silicon.

7. The system as defined in claim 4, including a layer comprising another metal between said multilayer interconnections and said portions of said circuit components.

8. An electrical connection system for an integrated circuit having a plurality of circuit components formed adjacent one surface of a semiconductor substrate, a first insulating layer on said one surface having openings exposing portions of said circuit components, said system comprising:

first multilayer interconnections on and adherent to said first insulating layer ohmically connecting and electrically interconnecting certain portions of said circuit components through said openings in said insulating layer, a second insulating layer on and adherent to said first multilayer interconnections having openings exposing portions of said first multilayer interconnections, second multilayer interconnections on and adherent to said second insulating layer ohmically engaging and electrically interconnecting the exposed portions of said first multilayer interconnections including a lower layer comprised of molybdenum, an intermediate high conductivity metal layer and an upper layer comprised of molybdenum, said second multilayer interconnections including a lower layer comprised of a homogeneous mixture of molybdenum and a modifier metal and an upper high conductivity metal layer, whereby said electrical connection system for an integrated circuit exhibits significant corrosion resistant properties in semiconductor device operating environments.

9. The electrical connection system as defined in claim 8, wherein said high conductivity metal layer is gold.

10. The electrical connection system as defined in claim 8, wherein said modifier metal is taken from the group consisting of titanium, tantalum, chromium, zirconium, hafnium, and silicon.

11. A nonhermetically mounted semiconductor device comprising a semicondcutor substrate having first and second zones of opposite conductivity types forming a p-n junction therebetween terminating at one surface of said substrate beneath an insulating layer on said one surface, said insulating defining an opening therein exposing a portion of said first zone, a metallic layer on and adherent to said insulating layer and ohmically connected to an exposed portion of said first zone through said opening, said metallic layer comprising a mixture of molybdenum and a modifier metal having greater corrosion resistance than molybdenum, whereby said device exhibits significant corrosion resistant properties in semiconductor device operating environments.

12. A nonhermetically mounted semiconductor device as defined in claim 11, including a high conductivity metal layer on at least a portion of said metallic layer.

13. A nonhermetically mounted semicondcutor device as defined in claim 12, wherein said high conductivity metal layer is gold.

14. The nonhermetically mounted semicondcutor device as defined in claim 11, wherein said modifier metal is taken from the group composed of titanium, tantalum, zirconium, chromium, hafnium, and silicon.

* * * * *